(12) United States Patent
Kaya

(10) Patent No.: US 6,194,267 B1
(45) Date of Patent: Feb. 27, 2001

(54) INTEGRATED CIRCUIT HAVING INDEPENDENTLY FORMED ARRAY AND PERIPHERAL ISOLATION DIELECTRICS

(75) Inventor: Cetin Kaya, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/168,047

(22) Filed: Oct. 7, 1998

(51) Int. Cl.$^7$ .................... H01L 21/76; H01L 21/8247
(52) U.S. Cl. ................... 438/257; 438/593; 438/294
(58) Field of Search ................... 437/52, 43, 67; 257/316; 365/185; 438/593, 257, 258, 692, 294

(56) References Cited

U.S. PATENT DOCUMENTS

| | | | |
|---|---|---|---|
| 5,208,179 | * 5/1993 | Okazawa | 437/52 |
| 5,587,332 | * 12/1996 | Chang et al. | 437/43 |
| 5,767,005 | * 6/1998 | Doan et al. | 438/593 |
| 5,898,197 | * 4/1999 | Fujiwara | 257/317 |
| 6,001,689 | * 12/1999 | Van Buskirk et al. | 438/266 |
| 6,004,829 | * 12/1999 | Chang et al. | 438/16 |
| 6,017,796 | * 1/2000 | Chen et al. | 438/264 |

\* cited by examiner

*Primary Examiner*—Mary Wilczewski
*Assistant Examiner*—David Goodwin
(74) *Attorney, Agent, or Firm*—Jacqueline J. Garner; Wade James Brady, III; Frederick J. Telecky, Jr.

(57) ABSTRACT

The invention comprises a method of forming an integrated circuit, the method comprising: (1) forming a first dielectric layer disposed outwardly from a semiconductor substrate; (2) forming a first intermediate structure outwardly from the a dielectric layer, the first intermediate structure comprising a floating gate layer disposed outwardly from the first dielectric layer, a second dielectric layer disposed outwardly from the floating gate layer, and a first polysilicon layer disposed outwardly from the second dielectric layer; (3) removing regions of the first intermediate structure to form at least one gate stack disposed outwardly from the first dielectric layer; and (4) forming at least one dielectric isolation region after the formation of the gate stacks, wherein the at least one dielectric isolation region is disposed between two gate stacks.

10 Claims, 5 Drawing Sheets

INTEGRATED CIRCUIT HAVING INDEPENDENTLY FORMED ARRAY AND PERIPHERAL ISOLATION DIELECTRICS

TECHNICAL FIELD OF THE INVENTION

This invention relates generally to the field of electronic devices, and more particularly, to an integrated circuit having independently formed array and peripheral isolation dielectrics.

BACKGROUND OF THE INVENTION

One type of modern nonvolatile memory is the EPROM or EEPROM device that uses floating gate structures. These floating gate memory structures may be integrated into a floating gate array which facilitates interface between the memory cells, control circuitry and high-voltage power sources. The memory cells use channel hot electrons for programming from the drain side and use Fowler-Nordheim tunneling for erasure from the source side. Due to the high voltages frequently used to program and erase the cells, high-voltage peripheral transistors may be implemented to provide an interface between a high-voltage source and the memory cells of the floating gate array. The control logic circuitry of the floating gate array typically functions with a lower operating voltage. Low-voltage peripheral transistors may be implemented to provide the logic circuitry for the array.

It is often desirable to fabricate peripheral transistors and the floating gate memory cells on a common semiconductor substrate. To ensure that each cell operates independently, regions of isolation dielectric may be formed between cells to electrically isolate the gates from one another. Typically, the isolation dielectrics for the memory cells are formed at the same time and are of the same construction as the isolation dielectrics for the peripheral transistors. In addition, to ensure appropriate coupling coefficients, the distal ends of floating gates in the memory cell area are made to overlap the isolation dielectric. The proper voltage applied to the control gate is proportional to the coupling coefficient of the device. Providing overlap of the ends of the floating gates over the isolation dielectric increases the coupling coefficient, allowing for a lower control gate voltage.

This approach has several disadvantages. One problem with this approach is that it is difficult to instill unique characteristics into the separate isolation dielectrics because they are formed contemporaneously. For example, memory cells frequently use high voltages for programming and erasing data. Peripheral transistors interfacing high voltage sources typically implement thicker gate oxides and larger isolation dielectric regions than those typically associated with memory cell gate oxides. Additionally, as memory cell sizes are reduced, their corresponding gate oxides become thinner and isolation dielectric regions become smaller. An approach that contemporaneously forms isolation dielectrics for memory cells and peripheral transistors cannot satisfy theses diverging specifications.

Another problem with this approach is that as the memory cells are scaled, they become intolerant to low levels of leakage current. The read current of each memory cell is directly proportional to the area of substrate supporting the floating gate, and inversely proportional to the thickness of the oxide separating the substrate and the floating gate. To facilitate integration with other scaled system elements, the width of the floating gates is frequently decreased. Maintaining a desired overlap of the floating gate over the isolation dielectric, however, requires a corresponding decrease in the substrate area supporting the gate. Decreasing this area width without reducing the gate oxide thickness results in degradation of the cell's read current. To maintain a desired read current, therefore, the thickness of the gate oxide must also decrease. Unfortunately, it is often impractical to decrease the gate oxide thickness because this leads to high levels of stress-induced leakage current. Therefore, it is difficult to scale these devices without either degrading the cell's read current or making them susceptible to stress-induced leakage currents.

Another problem with this approach is that the overlapping regions result in complex device topography, making it difficult to etch all of the polysilicon from the areas between floating gates. Failure to remove all of the polysilicon between floating gates may cause adjacent floating gates to short out.

Still another problem with this approach is that when used in conjunction with a configuration comprising trenches and moats within the substrate, the gate oxide layer tends to thin around the trench corners, causing data retention and threshold voltage nonuniformities.

SUMMARY OF THE INVENTION

In accordance with the teachings of the present invention, an integrated circuit having independently formed array and peripheral isolation dielectrics is provided that substantially eliminates or reduces the disadvantages associated with the prior techniques and processes.

According to one embodiment of the present invention, a method of forming an integrated circuit comprises forming a first dielectric layer disposed outwardly from a semiconductor substrate and forming a first intermediate structure outwardly from the first dielectric layer. The first intermediate structure comprises a floating gate layer disposed outwardly from the first dielectric layer, a second dielectric layer disposed outwardly from the floating gate layer and a first polysilicon layer disposed outwardly from the second dielectric layer. Next, regions of the first intermediate structure are removed to form at least one gate stack disposed outwardly from the substrate. After the formation of the gate stacks, at least one dielectric isolation region is formed between two gate stacks.

The invention has several important technical advantages. The dielectric isolation regions of the array are formed independently of the peripheral dielectric regions. Peripheral dielectric regions may be formed to a desired thickness for high voltage devices, while array dielectric regions may be scaled to minimize cell size. Additionally, the invention eliminates overlap between the distal ends of the floating gates and the isolation dielectric residing between the gates. The area of substrate supporting each floating gate may be maintained or increased despite the scaling of the floating gate width. A good read current is, therefore, maintained without creating stress-induced leakage current by thinning the gate oxide layer. Eliminating overlap between the floating gates and the isolation dielectric also facilitates creation of floating gates with little or no topography, making it easier to remove all polysilicon from between the floating gates. Use of relatively flat polysilicon layers solves problems associated with floating gate shorts caused by residual polysilicon residing between the floating gates. Also, because the floating gates do not extend beyond the trench corners, problems associated with oxide thinning such as nonuniformities in data retention and threshold voltages are reduced or eliminated.

BRIEF DESCRIPTION OF THE DRAWINGS

A more complete understanding of the teachings of the present invention may be acquired by referring to the accompanying figures in which like reference numbers indicate like features and wherein.

DETAILED DESCRIPTION OF THE INVENTION

Figure 1:
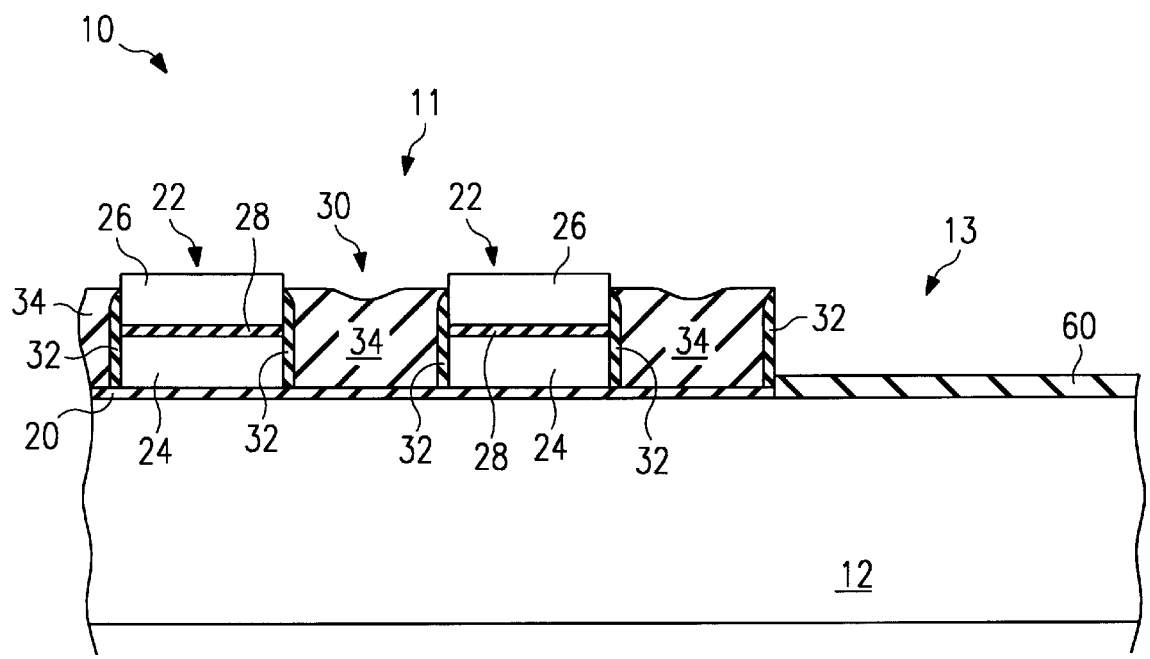
FIG. 1 is a cross-sectional view of a portion of one embodiment of an integrated circuit having independently formed array and peripheral isolation dielectric regions according to the teachings of the present invention.

FIG. 1 is a cross-sectional view of a portion of an integrated circuit 10 having independently formed array and peripheral isolation dielectric regions according to the teachings of the present invention. Integrated circuit 10 comprises a semiconductor substrate 12. A first dielectric layer 20 may be disposed outwardly from an array region 11 of integrated circuit 10. A peripheral dielectric layer 60 may be disposed outwardly from a peripheral region 13 of integrated circuit 10. First dielectric layer 20 and peripheral dielectric layer 60 may comprise, for example, layers of oxide. Other dielectric materials besides oxide may be used to form first and peripheral dielectric layers 20 and 60. First dielectric layer 20 may form a tunnel oxide layer for a floating gate array of memory cells subsequently formed in array region 11. Peripheral dielectric layer 60 may form a gate oxide layer for peripheral transistors subsequently formed in peripheral region 13.

Gate stacks 22 are disposed outwardly from substrate 12 and are separated from substrate 12 by first dielectric layer 20. Each gate stack 22 comprises a floating gate body 24 disposed outwardly from first dielectric layer 20. Each gate stack 22 further comprise a first polysilicon body 26 disposed outwardly from floating gate body 24 and separated from floating gate body 24 by a second dielectric region 28. Second dielectric region 28 may comprise any suitable dielectric material or combination of dielectric materials. Second dielectric region 28 may comprise, for example, oxide, nitride or a heterostructure comprising alternate layers of oxide and nitride. Dielectric isolation regions 30 may reside between gate stacks 22. Each dielectric isolation region may comprise an isolation oxide layer 32 disposed outwardly from the sidewalls of gate stacks 26. Dielectric isolation regions 30 may further comprise isolation dielectric layers 34 disposed outwardly from and between gate stacks 22.

To maximize the areas of substrate supporting gate stacks 22 and to minimize device topography, it may be desirable to form integrated circuit 10 such that floating gates 24 do not overlap dielectric isolation regions 30, as illustrated. Eliminating overlap between floating gate 24 and dielectric isolation regions 30, however, decreases the coupling coefficient of the device. Where no overlap exists, the capacitance between floating gate 24 and substrate 12 is comparatively greater because there is less dielectric separating the regions. An increase in the capacitance between floating gate 24 and substrate 12 without a corresponding increase in the capacitance between floating gate 24 and first polysilicon body 26 results in a reduced coupling coefficient.

To maintain a high coupling coefficient, it becomes desirable to increase the capacitance between floating gate 24 and first polysilicon body 26. The capacitance between floating gate body 24 and first polysilicon body 26 is inversely proportional to the thickness of second dielectric region 28 between them. By reducing the thickness of second dielectric region 28, the capacitance between the two gate bodies may be increased. The thickness of second dielectric region 28 may be reduced by an amount necessary to effect an increase in the floating gate/first polysilicon body capacitance which is equal to the increase in the gate/substrate capacitance caused by eliminating overlap with dielectric isolation regions 30. Second dielectric region 28 may be scaled, for example, to achieve a dielectric structure having a thickness of approximately 70 Å.

Figure 2:
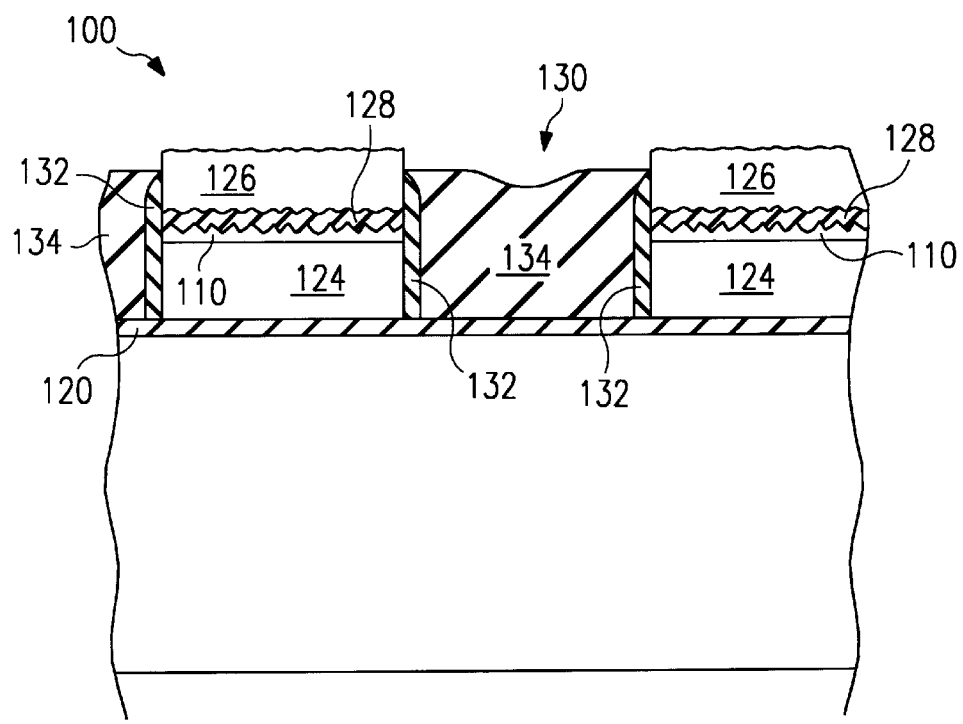
FIG. 2 is a cross-sectional view of a portion of another embodiment of an integrated circuit having independently formed array and peripheral isolation dielectric regions according to the teachings of the present invention.

FIG. 2 shows another method of increasing the capacitance between a floating gate 124 and a first polysilicon body 126 of an integrated circuit 100. The capacitance between floating gate body 124 and first polysilicon layer 126 is directly proportional to the surface area of these two bodies. The capacitance between the two gate bodies may, therefore, be increased by increasing the surface area of one or both structures. The effective surface area of floating gate body 124 and first polysilicon body 126 may be increased by forming a hemispherical grain poly layer 110 outwardly from floating gate 124. Hemispherical grain poly layer 110 creates a rough surface outwardly from floating gate 124. Forming second dielectric region 128 outwardly from hemispherical grain poly layer 110 creates a rough surface on second dielectric region 128 during its formation. The rough surface on second dielectric region 128, in turn, creates a rough surface on first polysilicon body 126 when it is formed. The rough surface of first silicon body 126 creates additional effective surface area between floating gate body 124 and first polysilicon body 126, which increases the capacitance between these bodies, resulting in a higher coupling coefficient.

In another embodiment (not explicitly shown), the outer surface of first polysilicon body 124 may be roughened rather than forming a separate hemispherical grain poly layer 110. In this embodiment, the outer surface of first polysilicon layer 124 may be made rough by altering the deposition parameters during formation of first polysilicon body 124. This embodiment results in the same rough surface exhibited by hemispherical grain poly layer 110, without the formation of a separate structural layer.

FIGS. 3A–3D are cross-sectional views of a portion of a partially completed integrated circuit having independently formed array and peripheral isolation dielectrics constructed according to the teachings of the present invention.

Depending on the application and fabrication techniques employed, integrated circuit 10 may, but need not comprise a plurality of trenches and a plurality of moats formed adjacent to the plurality of trenches in semiconductor substrate 12 (not explicitly shown). Trenches and moats may be formed at a variety of points in the fabrication process and by a variety of methods. For example, trenches and moats may be formed contemporaneously with the formation of gate stacks 22 using the same etch used to form gate stacks 22. In that case, the trenches may be filled with a dielectric similar to that used for dielectric isolation region 30 described with reference to FIG. 1. Alternatively, trenches and moats may be formed by etching away regions of substrate 12 prior to formation of gate stacks 22. In that case, regions of trench dielectric may be disposed within the trenches to substantially fill the trenches. First dielectric layer 20 may then be formed outwardly from substrate 12.

Figure 3A:
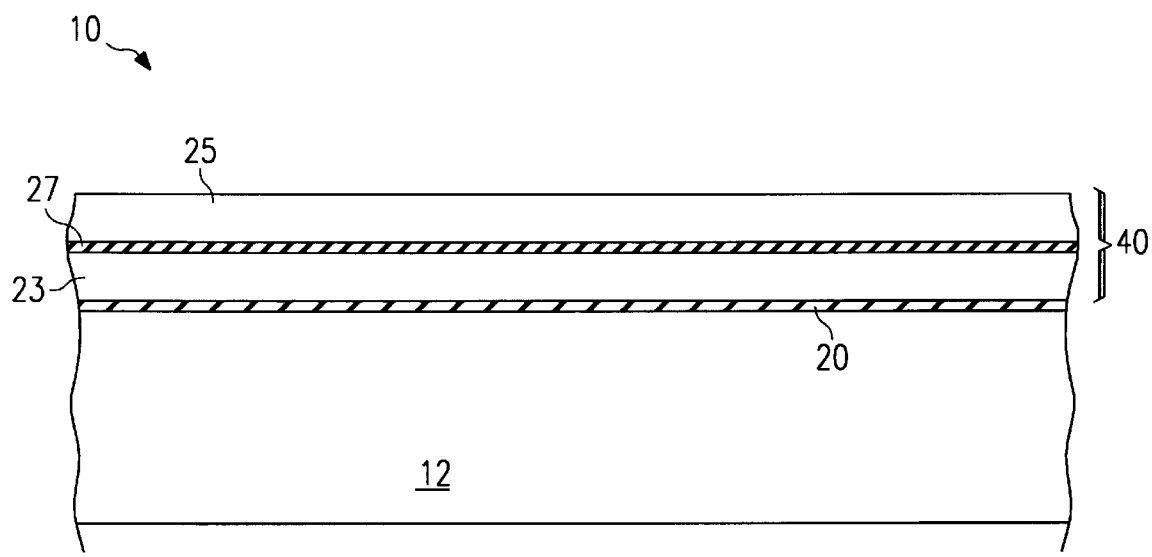
FIGS. 3a–3d are a series of cross sectional views showing a portion of a partially completed integrated circuit having independently formed array and peripheral isolation dielectric regions constructed according to the teachings of the present invention.

FIG. 3A shows integrated circuit 10 after formation of a first immediate structure 40 disposed outwardly from first dielectric layer 20. First dielectric layer 20 may be formed outwardly from substrate 12. As described above, trenches and moats may, but need not be formed in substrate 12 prior to formation of first dielectric layer 20. If trenches are formed at that point, regions of trench dielectric may be disposed within the trenches to fill the trenches. Next, floating gate layer 23 may be formed outwardly from first dielectric layer 20. Floating gate layer 23 may comprise, for example, polysilicon or amorphus silicon. Floating gate layer 23 may later be used to form floating gates 24 of a memory cell array in array region 11 (FIG. 1).

A second dielectric layer 27 may be formed outwardly from floating gate layer 23. Second dielectric layer 27 may comprise any suitable dielectric material or combination of dielectric materials. Second dielectric layer 27 may comprise, for example, oxide, nitride or a heterostructure comprising alternate layers of oxide and nitride. Second dielectric layer 27 may later form second dielectric regions 28 of gate stacks 22 (see FIG. 1). As described above, second dielectric layer 27 may be scaled to form a dielectric structure having a thickness of approximately 70 Å. Because of such scaling, the capacitance between floating gate 24 and first polysilicon body 26 increases to maintain a constant coupling coefficient. Alternatively, the capacitance between floating gate 24 and first polysilicon body 26 may be increased by forming hemispheric grain poly layer 110 (FIG. 2) outwardly from floating gate layer 23. Formation of such a layer causes first polysilicon layer 126 to develop a rough surface, thus creating additional surface area, and therefore higher capacitance between floating gate 24 and first polysilicon layer 26.

A first polysilicon layer 25 may be formed outwardly from second dielectric layer 27. First polysilicon layer 25 may later form first polysilicon bodies 26 of gate stacks 22. Floating gate layer 23, second dielectric layer 27 and first polysilicon layer 25, collectively form a first intermediate structure 40.

Figure 3B:
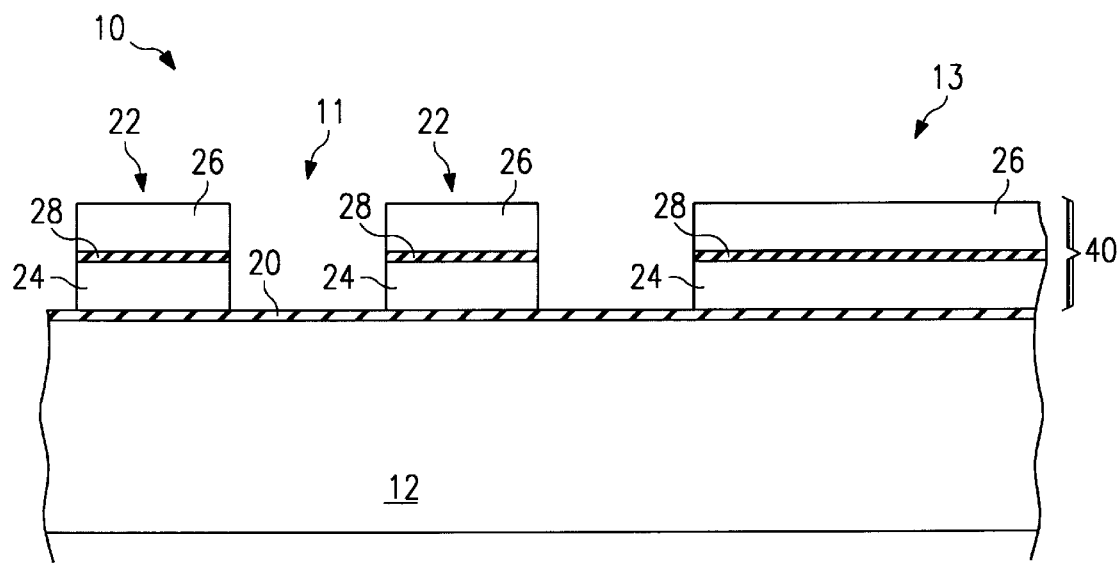

FIG. 3B shows integrated circuit 10 after the formation of gate stacks 22. Gate stacks 22 may be formed, for example, by masking areas of first intermediate structure 40 where gates stacks are desired. The exposed areas of first intermediate structure 40 may then be etched away leaving gate stacks 22. Integrated circuit 10 may, but need not comprise trenches in substrate 12 between gate stacks 22 and moats disposed inwardly from gate stacks 22. One method of forming trenches and moats in substrate 12 is to construct them contemporaneously with the fabrication of gate stacks 22. Trenches, moats and gate stacks 22 may be formed, for example, using the same pattern etch used to form gate stacks 22. During this etch, regions of first dielectric layer 20 and substrate 12 residing between gate stacks 22 may be etched away to form trenches between gate stacks 22 and moats inwardly from gate stacks 22.

Figure 3C:
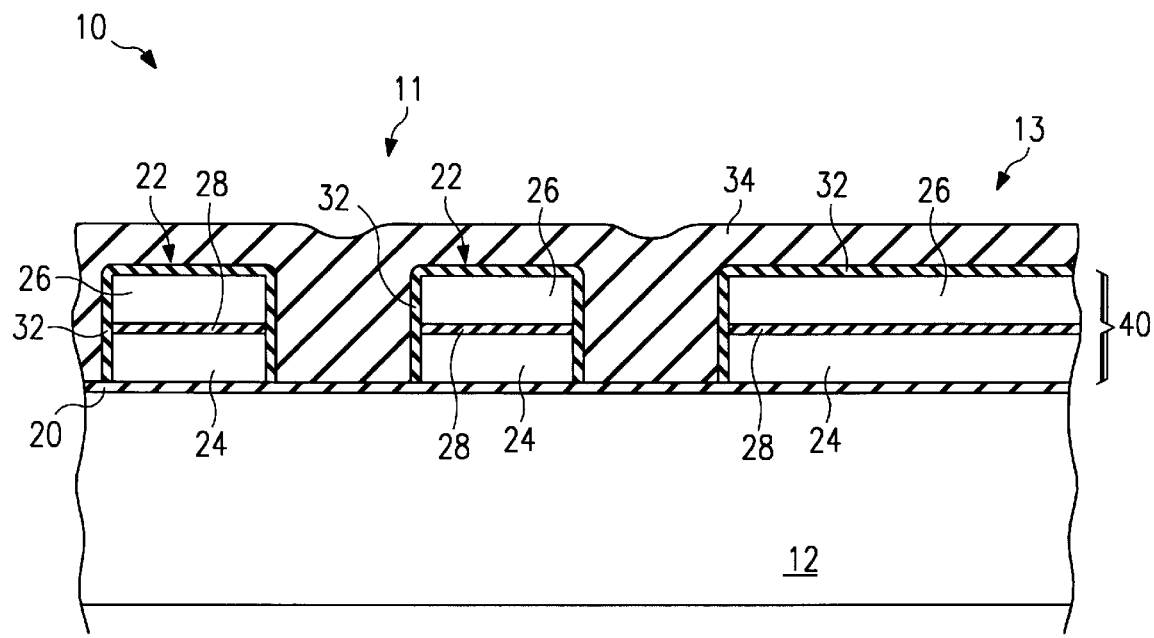

FIG. 3C shows integrated circuit 10 during the formation of isolation oxide layer 32 and isolation dielectric layer 34.

Isolation oxide layers 32 may be formed, for example, by growing approximately 200 Å of oxide outwardly from gate stacks 22 to provide a good quality oxide layer adjacent to the sidewalls of gate stacks 22. Isolation dielectric layer 34 may be formed, for example, by depositing approximately 0.5 micrometers of oxide outwardly from and between gate stacks 22. If trenches are formed between gate stacks 22 contemporaneously with the formation of gate stacks 22, isolation dielectric layer 34 may also be deposited to fill the trenches. Isolation oxide layer 32 may be formed before or after the deposition of dielectric isolation region 34.

Figure 3D:
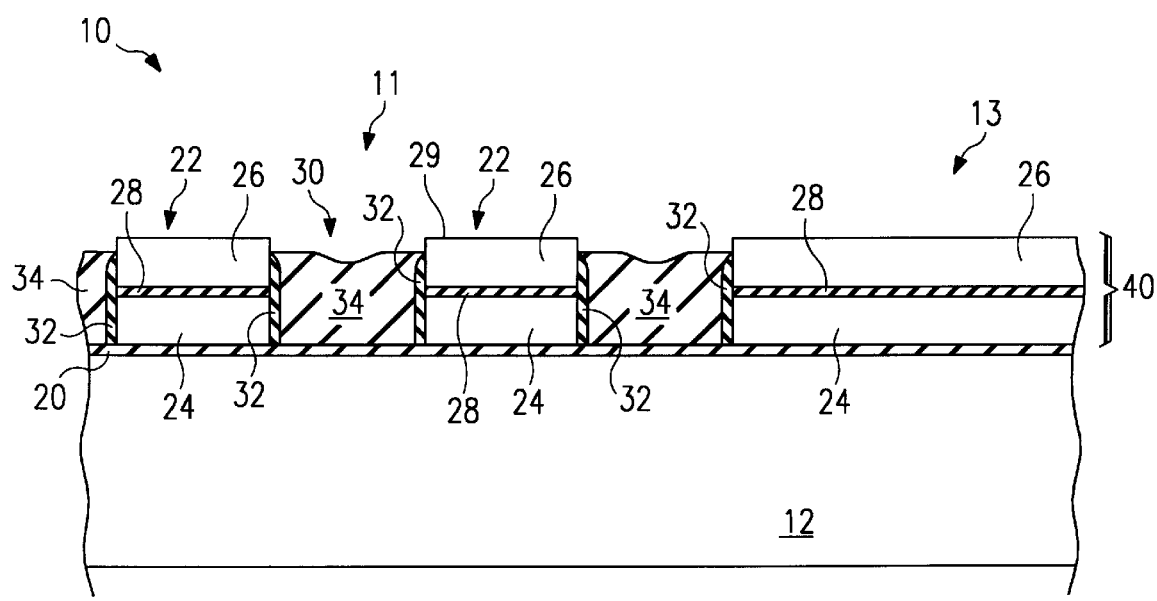

FIG. 3D shows integrated circuit 10 after portions of isolation oxide layer 32 and isolation dielectric layer 34 have been etched away to expose at least an outer surface 29 of first polysilicon layer 26. Remaining portions of isolation oxide layer 32 and isolation dielectric layer 34 between gate stacks 22 comprise dielectric isolation regions 30.

FIGS. 3A–3D show cross-sectional drawings of a portion of integrated circuit 10 in a direction perpendicular to bit lines (not explicitly shown) which may subsequently formed using gate stacks 22. Word lines (not explicitly shown) may subsequently be formed perpendicular to the bit lines utilizing gate stacks 22.

FIGS. 4A–4D are schematic diagrams showing cross-sectional views of a series of process steps in the formation of integrated circuit 10, and specifically a gate oxide layer and gate for a peripheral transistor of integrated circuit 10.

Figure 4A:
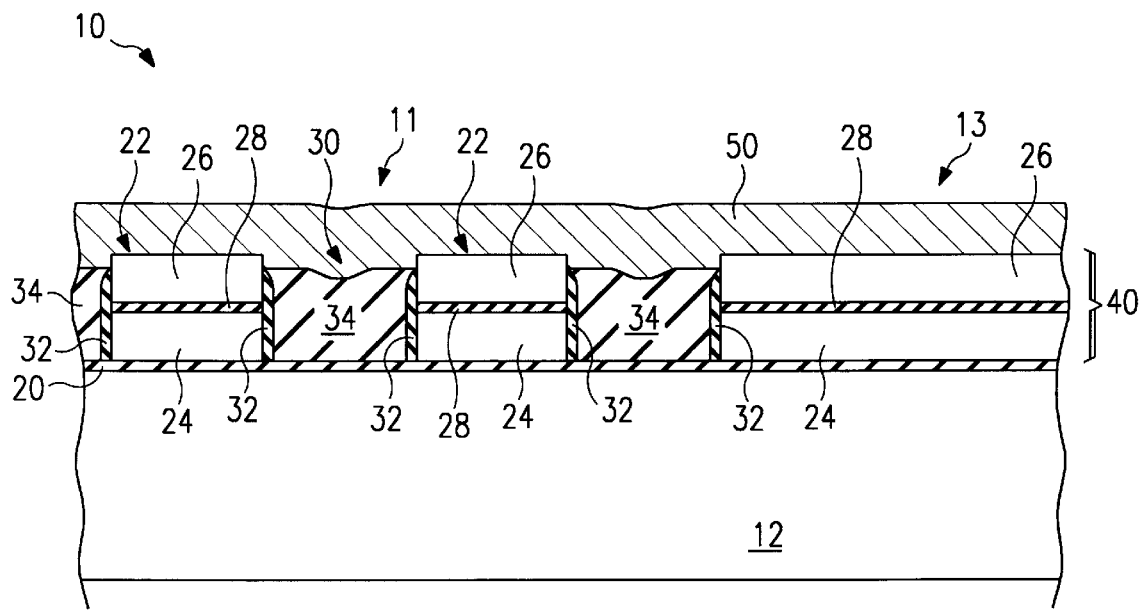
FIGS. 4a–4d are a series of cross-sectional views showing a portion of a partially completed integrated circuit having independently formed array and peripheral isolation regions completed according to the teachings of the present invention.

FIG. 4A shows integrated circuit 10 after dielectric isolation regions 30 have been formed between gate stacks 22, and a second polysilicon layer 50 has been disposed outwardly from first polysilicon layer 26 and dielectric isolation layers 30. First polysilicon layer 26 and second polysilicon layer 50 may later form control gates for floating gate memory cells of array region 11.

Figure 4B:
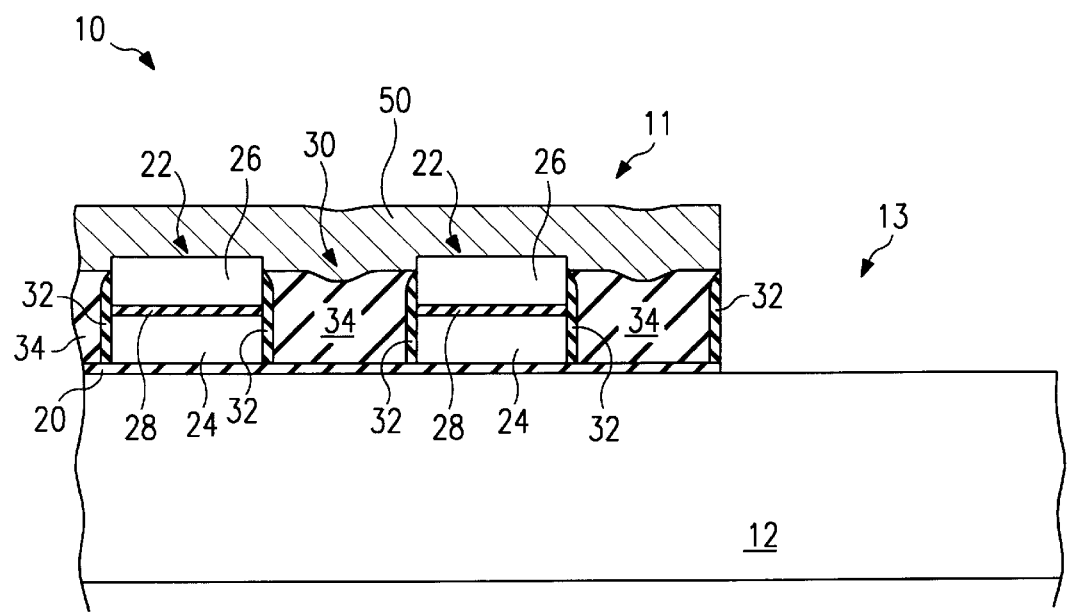

FIG. 4B shows integrated circuit 10 after removal of first dielectric layer 20, first intermediate structure 40 and second polysilicon layer 50 from peripheral region 13 of integrated circuit 10. Second polysilicon layer 50 and first intermediate structure 40 may be removed, for example, by masking floating gate array region 11 and etching first intermediate structure 40 and second polysilicon layer 50 from exposed peripheral region 13. First dielectric layer 20 may be removed from peripheral region 13 by, for example, wet deglazing.

Figure 4C:
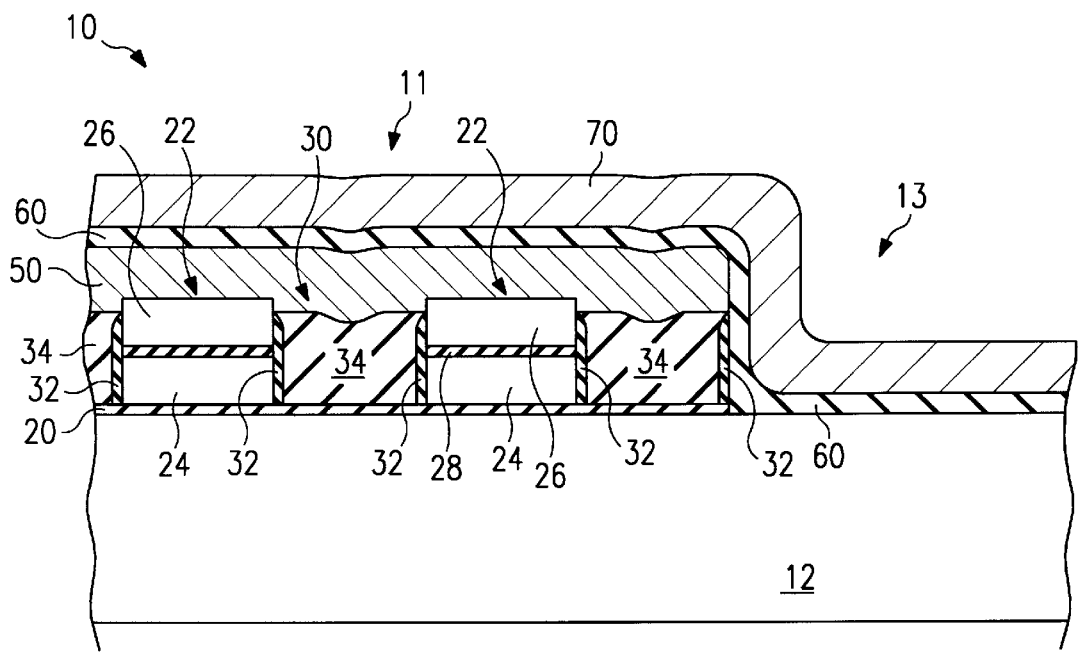

FIG. 4C shows integrated circuit 10 after the formation of a peripheral dielectric layer 60 and a third polysilicon layer 70. Peripheral dielectric layer 60 may be formed outwardly from second polysilicon layer 50 in floating gate array region 11 and outwardly from substrate 12 in peripheral region 13. Peripheral dielectric layer 60 may be formed by any suitable method, such as by deposition or thermal growth. If peripheral dielectric layer 60 is formed through thermal growth, its thickness may be greater in array region 11 than in peripheral region 13. This is due to doping of second polysilicon layer 50, which causes increased growth of thermally grown dielectrics. Peripheral dielectric layer 60 may comprise, for example, oxide or any other suitable dielectric or combination of dielectrics. Third polysilicon layer 70 may be disposed outwardly from peripheral dielectric layer 60. Third polysilicon layer 70 may later form gates of peripheral transistors of integrated circuit 10.

Figure 4D:
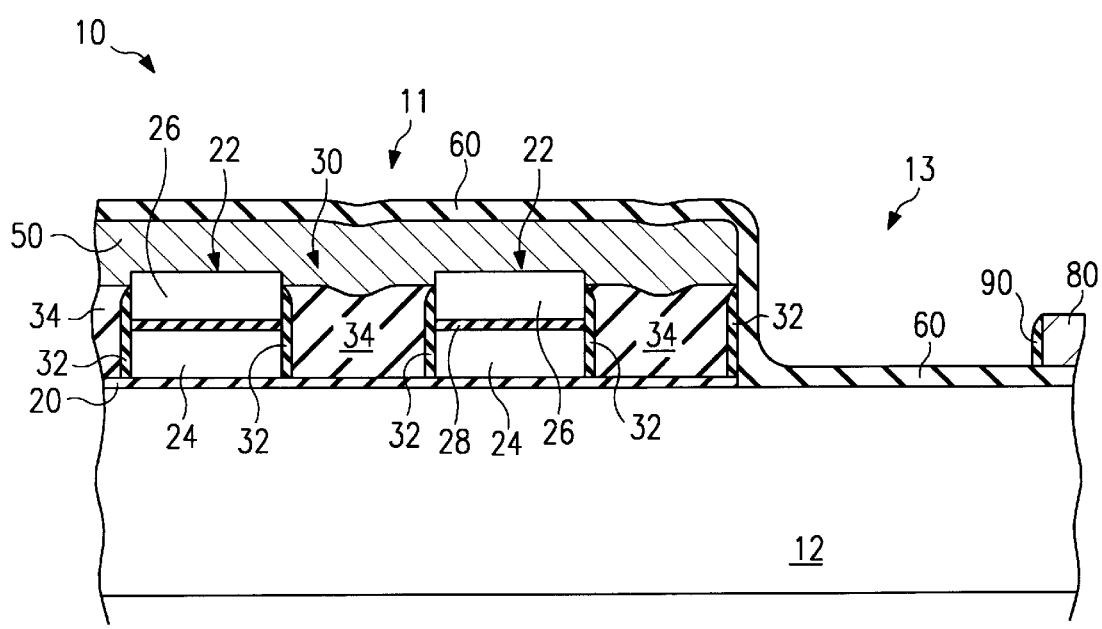

FIG. 4D shows integrated circuit 10 after the formation of a gate 80 in peripheral region 13. Gate 80 may be formed, for example, by forming a peripheral gate pattern (not shown) outwardly from peripheral dielectric layer 60. The peripheral gate pattern may mask regions of third polysilicon layer 70 outwardly from peripheral region 13, leaving all other areas of third polysilicon layer 70 exposed. Peripheral gates 80 may be formed by etching exposed regions of third polysilicon layer 70 leaving peripheral gates 80 disposed outwardly from peripheral region 13. Sidewall spacers 90 may be formed outwardly from the sidewalls of peripheral gates 80 by any suitable method.

Although the present invention has been described in detail, it should be understood that various changes, substitutions, and alterations can be made hereto without departing from the spirit and scope of the invention as defined by the appended claims.

What is claimed is:

1. A method for forming an integrated circuit comprising:
    forming a first dielectric layer disposed outwardly from a semiconductor substrate;
    forming a first intermediate structure comprising:
        a floating gate layer disposed outwardly from the first dielectric layer;
        a second dielectric layer disposed outwardly from the floating gate layer; and
        a first polysilicon layer disposed otuwardly from the second dielectric layer;
    removing regions of the first intermediate structure to form a plurality of gate stacks;
    forming a dielectric isolation region after the formation of the gate stacks disposed between said gate stacks;
    forming a second polysilicon layer disposed outwardly from the first polysilicon layer and the dielectric isolation layer;
    masking a portion of the second polysilicon layer disposed outwardly from a floating gate array region of the substrate, the floating gate array region disposed inwardly from said plurality of gate stacks;
    removing a portion of the second polysilicon layer and a portion of the first intermediate structure disposed outwardly from a peripheral region of the substrate, the peripheral region disposed adjacent to the floating gate array region of the substrate;
    deglazing a portion of the first dielectric layer disposed outwardly from the peripheral region of the substrate;
    forming a peripheral dielectric layer outwardly from the peripheral region of the substrate and the second polysilicon layer;
    forming a third polysilicon layer outwardly from the peripheral dielectric layer;
    forming a peripheral gate pattern outwardly from the peripheral dielectric layer, the peripheral gate pattern masking at least one region of the third polysilicon layer where a peripheral gate will be formed;
    removing exposed regions of the third polysilicon layer leaving at least one peripheral gate disposed outwardly from the peripheral region of the substrate.

2. The method of claim 1, wherein forming a dielectric isolation region comprises:
    growing an isolation oxide layer outwardly from the gate stacks;
    depositing an isolation dielectric layer outwardly from and between the gate stacks; and
    removing at least a portion of the isolation oxide layer and the isolation dielectric layer to expose at least an outer surface of the first polysilicon layer.

3. The method of claim 1, wherein forming a dielectric isolation region comprises:
    growing approximately 200 Å of oxide outwardly from the gate stacks;
    depositing approximately 0.5 micrometers of oxide outwardly from and between the gate stacks; and
    removing at least a portion of the isolation oxide layer and the isolation dielectric layer to expose at least an outer surface of the first polysilicon layer.

4. The method of claim 1, wherein the steps of forming a plurality of gate stack, and forming an isolation dielectric region comprise:
    removing at least a portion of the first intermediate structure and the substrate to form a plurality of trenches disposed adjacently to a plurality of moats in the substrate and at least one gate stack disposed outwardly from a moat;
    depositing an isolation dielectric layer outwardly from the trenches in the substrate and outwardly from and between the gate stacks;
    growing an isolation oxide layer outwardly from the gate stack; and
    removing at least a portion of the isolation oxide layer and the isolation dielectric layer to expose at least an outer surface of the first polysilicon layer.

5. The method of claim 1, further comprising:
    forming a plurality of trenches disposed adjacent to a plurality of moats in the semiconductor substrate; and
    forming trench dielectric regions outwardly from the trenches in the substrate.

6. The method of claim 5, wherein forming a dielectric isolation region comprises:
    depositing a field oxide layer within the trenches;
    growing approximately 200 Å of oxide outwardly from the gate stacks;
    depositing approximately 0.5 micrometers of oxide outwardly from and between the gate stacks outwardly from the field oxide layer; and
    removing at least a portion of the isolation oxide layer and the isolation dielectric layer to expose at least an outer surface of the first polysilicon layer.

7. The method of claim 1, wherein the second dielectric layer comprises a layer of oxide having a thickness of approximately 70 Å.

8. The method of claim 1, further comprising depositing a hemispherical grain poly layer outwardly from the floating gate layer.

9. The method of claim 1, wherein the floating gate layer comprises a rough outer surface.

10. The method of claim 1, further comprising forming a peripheral dielectric layer outwardly from a peripheral region of the substrate, the peripheral region of the substrate disposed adjacent to a region of the substrate supporting the at least one gate stack.

* * * * *

UNITED STATES PATENT AND TRADEMARK OFFICE
CERTIFICATE OF CORRECTION

PATENT NO.   : 6,194,267 B1
DATED        : February 27, 2001
INVENTOR(S)  : Cetin Kaya It is certified that error appears in the above-identified patent and that said Letters Patent is hereby corrected as shown below:

<u>Title page,</u>
Under "Related U.S. Application Data," the following should be added:

-- Provisional application No. 60/060,561, Sept. 30, 1997 --

Signed and Sealed this

Twenty-third Day of October, 2001

*Attest:*

*Nicholas P. Godici*

*Attesting Officer*

NICHOLAS P. GODICI
*Acting Director of the United States Patent and Trademark Office*